United States Patent
Yamakami et al.

(10) Patent No.: US 9,266,312 B2
(45) Date of Patent: Feb. 23, 2016

(54) BONDING APPARATUS AND BONDING METHOD

(71) Applicant: FUJITSU LIMITED, Kawasaki-shi, Kanagawa (JP)

(72) Inventors: Takatoyo Yamakami, Nagano (JP); Takashi Kubota, Chikuma (JP); Hidehiko Kira, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 210 days.

(21) Appl. No.: 14/153,786

(22) Filed: Jan. 13, 2014

(65) Prior Publication Data

US 2014/0290850 A1    Oct. 2, 2014

(30) Foreign Application Priority Data

Mar. 28, 2013 (JP) ................. 2013-067995

(51) Int. Cl.
B29C 65/48 (2006.01)
B32B 37/12 (2006.01)
G02B 6/42 (2006.01)

(52) U.S. Cl.
CPC .............. *B32B 37/12* (2013.01); *G02B 6/4204* (2013.01); *G02B 6/4214* (2013.01); *G02B 6/4221* (2013.01); *G02B 6/4239* (2013.01)

(58) Field of Classification Search
CPC .... B29C 37/00; G02B 6/4204; G02B 6/4214; G02B 6/4221; G02B 6/4239
See application file for complete search history.

(56) References Cited

U.S. PATENT DOCUMENTS

2006/0191631 A1 * 8/2006 Kojima .................. C09J 5/06
156/272.8
2008/0202677 A1 * 8/2008 Ok ......................... H01L 24/81
156/272.8

FOREIGN PATENT DOCUMENTS

| JP | 11-218650 | 8/1999 |
| JP | 2000-58567 | 2/2000 |
| WO | 03-041478 | 5/2003 |

* cited by examiner

*Primary Examiner* — Daniel McNally
(74) *Attorney, Agent, or Firm* — Fujitsu Patent Center

(57) ABSTRACT

A bonding apparatus has a light source, a stage, a component holder formed of a light transparent material, a controller, and a driver configured to drive the stage and the component holder under the control of the controller. The component holder includes an incident surface on which light outputted from the light source is made incident, a first reflection surface which is a surface opposite to the incident surface and reflects the incident light from the incident surface, a second reflection surface which reflects the light reflected by the first reflection surface, and an exit surface from which the light reflected by the second reflection surface exits. The bonding apparatus bonds the first component and the second component together with the photo-curing adhesive while holding the second component on the side of the exit surface of the component holder.

9 Claims, 10 Drawing Sheets

| ANGLE OF FIRST REFLECTION SURFACE ($\theta_1$) | UV ARRIVAL RATE (B÷A) |
|---|---|
| 45 | 0.166% |
| 47 | 0.566% |
| 49 | 0.997% |
| 51 | 1.513% |
| 53 | 2.151% |
| 55 | 2.630% |
| 57 | 2.888% |
| 60 | 2.792% |
| 62 | 2.531% |
| 70 | 0.205% |
| 80 | 0.001% |
| 90 | 0.001% |

| ANGLE $\theta_2$ | 0 | 0.5 | 1 | 2 | 3 | 5 | 7 | 10 | 20 | 30 |
|---|---|---|---|---|---|---|---|---|---|---|
| UV ARRIVAL RATE | 59% | 59% | 58% | 57% | 54% | 46% | 35% | 22% | 6% | 3% |
| IN-PLANE DISTRIBUTION | 55% | — | 70% | 79% | 86% | 91% | 90% | 88% | 65% | — |

BONDING APPARATUS AND BONDING METHOD

CROSS-REFERENCE TO RELATED APPLICATION

This application is based upon and claims the benefit of priority of the prior Japanese Patent Application No. 2013-67995, filed on Mar. 28, 2013, the entire contents of which are incorporated herein by reference.

FIELD

The embodiments discussed herein are related to a bonding apparatus and a bonding method of bonding components to each other with a photo-curing adhesive.

BACKGROUND

Optical interconnections have many advantages over electric interconnections, such as a higher degree of freedom in designing, a higher transmission rate, and smaller interconnection space. Accordingly, the optical interconnections are expected to be applied to electronic devices such as super computers, high-performance servers and mobile terminals.

In an optical interconnection, a light-emitting element and a light-receiving element are optically connected to each other with an optical waveguide, a mirror and the like, for example.

Patent document 1: International Publication Pamphlet No. WO2003/041478

SUMMARY

An aspect of the disclosed technology provides a bonding apparatus that includes a light source, a stage on which a first component is to be mounted, a component holder formed of a light transparent material and configured to hold a second component, a controller, and a driver configured to be controlled by the controller to change a distance between the first component mounted on the stage and the second component held by the component holder. The component holder includes an incident surface on which light outputted from the light source is made incident, a first reflection surface which is a surface opposite to the incident surface and reflects the incident light from the incident surface, a second reflection surface which reflects the light reflected by the first reflection surface, and an exit surface from which the light reflected by the second reflection surface exits. The first component and the second component are bonded together with a photo-curing adhesive in a state where the component holder holds the second component on a side of the exit surface.

Another aspect of the disclosed technology provides a method of bonding a first component and a second component together with a photo-curing adhesive. The method includes: holding the second component on a side of an exit surface of a component holder formed of a transparent material and including an incident surface on which light outputted from a light source is made incident, a first reflection surface which is a surface opposite to the incident surface and reflects the incident light from the incident surface, a second reflection surface which reflects the light reflected by the first reflection surface, and the exit surface from which the light reflected by the second reflection surface exits; aligning the first component and the second component with the photo-curing adhesive applied therebetween, and curing the photo-curing adhesive by making light incident into the component holder from the incident surface.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, prior to describing embodiments, a prelude is described for facilitating understanding of the embodiments.

Figure 1:
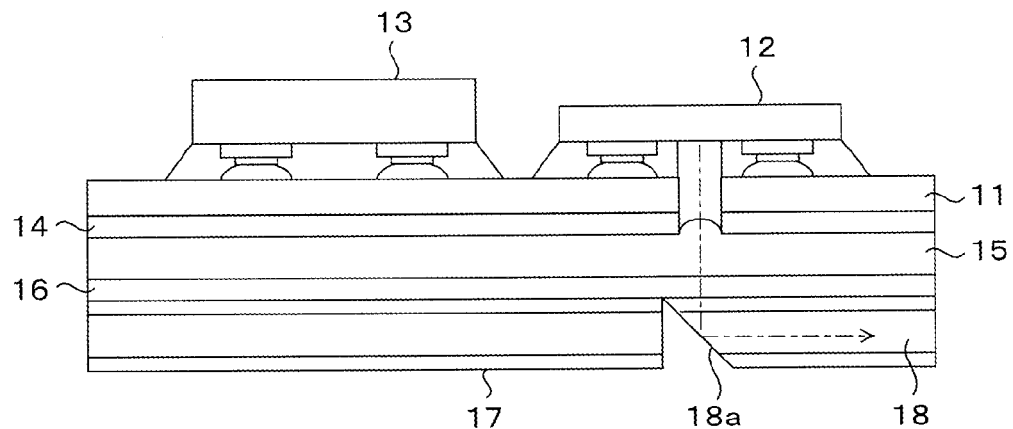
FIG. 1 is a cross-sectional view illustrating an example of an optical interconnection.

FIG. 1 is a cross-sectional view illustrating one example of an optical interconnection. In the optical interconnection illustrated in FIG. 1, a VCSEL (surface emitting laser) 12 and an integrated circuit (IC) 13 which drives the VCSEL 12 are mounted on a printed-circuit board 11.

A lens sheet 15 is bonded to a lower surface of the printed-circuit board 11 with an adhesive 14, and an optical waveguide sheet 17 is bonded to a lower surface of the lens sheet 15 with an adhesive 16.

An optical waveguide 18 is provided in the optical waveguide sheet 17 and a mirror 18a is arranged at an end portion of the optical waveguide 18.

A laser beam emitted from the VCSEL 12 arrives at the lens sheet 15 through a hole provided in the printed-circuit board 11, is concentrated by the lens sheet 15, is reflected by the mirror 18a, and then travels along the optical waveguide 18.

In the optical interconnection illustrated in FIG. 1, the laser beam passes through the adhesive 16 with which the lens sheet 15 and the optical waveguide sheet 17 are bonded together. Accordingly, the adhesive 16 prefers to have a high light transmittance. In addition, the adhesive 16 also prefers to be cured at a temperature lower than the heat resistant temperature of the lens sheet 15 or the optical waveguide sheet 17, for example, a temperature of 140° C. or below.

Currently, a thermosetting adhesive with a light transmittance of 90% or more is used as the adhesive 16 with which the lens sheet 15 and the optical waveguide sheet 17 are bonded together. However, such a thermosetting adhesive takes several tens of minutes to be cured sufficiently at a low temperature of 140° C. or below. Hence, the low productivity is a problem.

To improve the productivity, a UV (ultraviolet) light curing adhesive may be used as the adhesive 16. However, the UV light curing adhesive is not usable by a conventional bonding apparatus which is used for bonding a lens sheet and an optical waveguide sheet together. The reasons are described below.

Figure 2A:
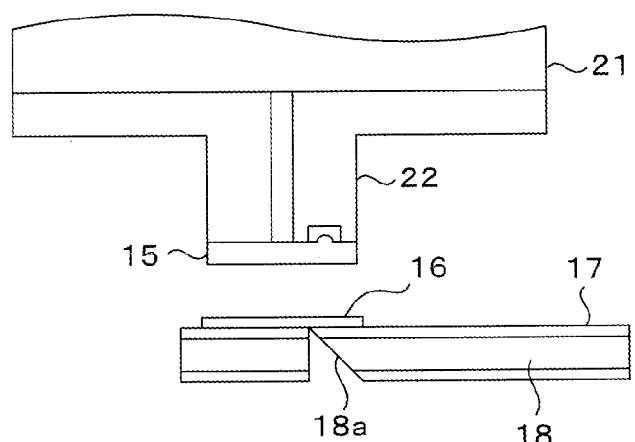
FIGS. 2A and 2B are cross-sectional views illustrating an example of a method of bonding an optical waveguide sheet and a lens sheet together.
Figure 2B:
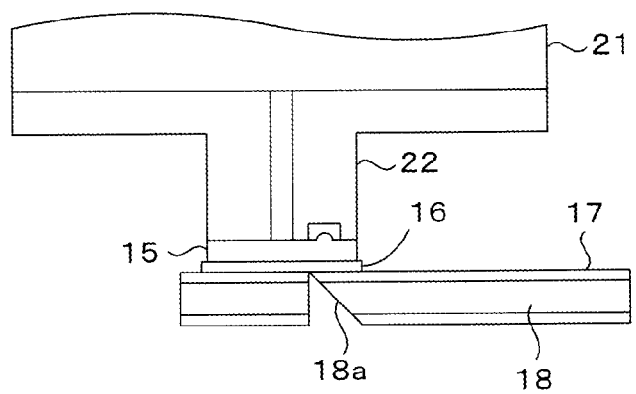

FIGS. 2A and 2B are cross-sectional views illustrating an example of a method of bonding the optical waveguide sheet 17 and the lens sheet 15 together. As illustrated in FIGS. 2A and 2B, the bonding apparatus includes a mounting head 21 and a component holder 22 arranged under the mounting head 21.

As illustrated in FIG. 2A, the lens sheet 15 is placed above the optical waveguide sheet 17 while being vacuum-suctioned under the component holder 22. Also, an appropriate amount of the adhesive 16 is applied onto the optical waveguide sheet 17. Here, the adhesive 16 is a thermosetting adhesive.

Next, as illustrated in FIG. 2B, as the mounting head 21 is lowered, the lens sheet 15 is placed on top of the optical waveguide sheet 17 and the adhesive 16 wets and spreads between the lens sheet 15 and the optical waveguide sheet 17.

A heater is provided in the mounting head 21. Heat generated by the heater is transferred to the adhesive 16 through the component holder 22, so that the adhesive 16 is cured. The component holder 22 holds the lens sheet 15 until the adhesive 16 is sufficiently cured to prevent positional displacement.

In the case of using such a bonding apparatus with a UV light curing adhesive used as the adhesive 16, it is difficult to irradiate the adhesive 16 with the UV light due to the component holder 22, which acts as an obstacle.

Figure 3:
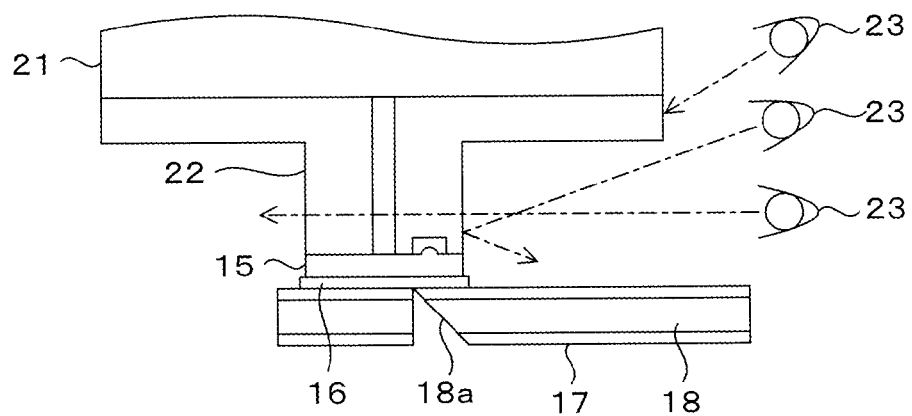
FIG. 3 is a schematic diagram illustrating a problem in the case of using a conventional bonding apparatus and an UV light curing adhesive as an adhesive.

To avoid this, the component holder 22 may be formed of a transparent material such as glass. Even in this case, however, it is difficult to irradiate the adhesive 16 under the component holder 22 evenly and sufficiently with the UV light, because the mounting head 21 acts as an obstacle, light is reflected by a side surface of the component holder 22, or light passes through the component holder 22, as illustrated in FIG. 3. Note that reference sign 23 in FIG. 3 is a light source to emit the UV light and each broken arrow in the drawing is a travelling direction of the light.

Figure 4:
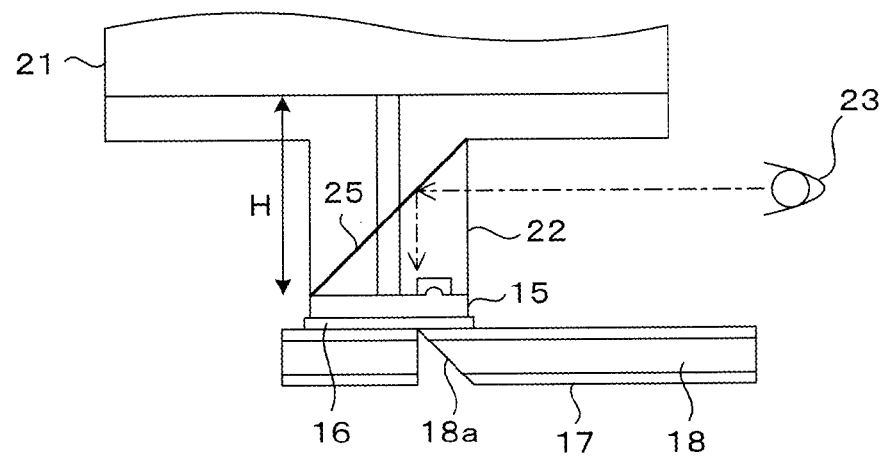
FIG. 4 is a schematic diagram illustrating a problem in the case of a component holder formed of a transparent material and provided with a mirror thereinside.

As illustrated in FIG. 4, the component holder 22 may be formed of a transparent material and a mirror 25 may be placed inside the component holder 22. In this case, however, there is a problem that the height H of the component holder 22 is so long that the component holder 22 may warp to lower component mounting accuracy. Also, in the case of curing the UV light curing adhesive by using both heat and UV light, there is a problem that the long length H of the component holder 22 inhibits heat from being sufficiently transferred from the mounting head 21 to the adhesive 16 and makes a curing time longer.

In the following embodiments, description is provided for a bonding apparatus and a bonding method capable of accurately bonding components together in a short period of time by a photo-curing adhesive.

First Embodiment

Figure 5:
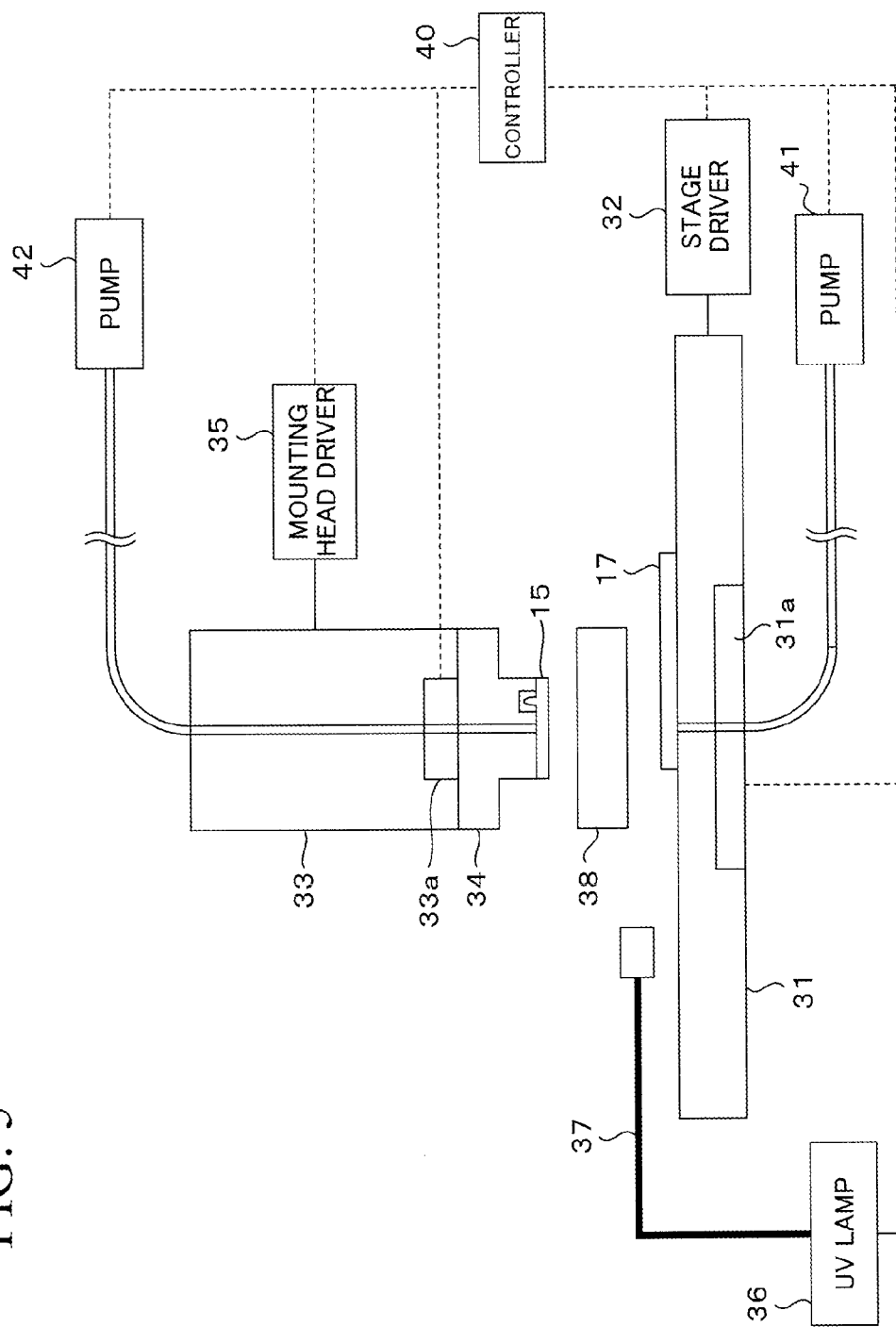
FIG. 5 is a block diagram illustrating a configuration of a bonding apparatus according to a first embodiment.

FIG. 5 is a block diagram illustrating a configuration of a bonding apparatus according to a first embodiment.

As illustrated in FIG. 5, a bonding apparatus according to the present embodiment includes a stage 31, a stage driver 32, a mounting head 33, a component holder 34, a mounting head driver 35, a UV light lamp 36, a light guide 37, a camera 38, and a controller 40.

An optical waveguide sheet 17 is placed on the stage 31. The stage 31 is provided with a hole connected with a vacuum pump 41, and the optical waveguide sheet 17 is vacuum-suctioned and thereby fixed on the stage 31. The stage 31 is driven by the stage driver 32 to move in a horizontal direction (XY direction). Furthermore, a heater 31a to be controlled by the controller 40 is arranged in the stage 31.

The mounting head 33 is driven by the mounting head driver 35 to move in a vertical direction (Z direction). The mounting head 33 is provided with a tilt angle adjusting mechanism (not illustrated) capable of adjusting a tilt angle of the mounting head 33. Furthermore, the mounting head 33 is also provided with a heater 33a to be controlled by the controller 40.

The component holder 34 is arranged under the mounting head 33. The component holder 34 is formed of a transparent material such as glass or acryl resin and has a hole connected with a vacuum pump 42. The lens sheet 15 is vacuum-suctioned under the component holder 34. The component holder 34 is described in detail later.

The camera 38 is arranged between the component holder 34 and the stage 31 before the lens sheet 15 and the optical waveguide sheet 17 are bonded to each other. The controller 40 controls the stage driver 32 based on an image captured by the camera 38, and thereby moves the stage 31 to align the lens sheet 15 and the optical waveguide sheet 17 with each other. After the alignment is finished, the camera 38 moves aside under the control of the controller 40.

The UV light lamp 36 lights under the control of the controller 40. The UV light generated by the UV light lamp 36 passes through the light guide 37 and is emitted from a tip end of the light guide 37 toward a side surface (an incident surface a) of the component holder 34 as described later.

The controller 40 includes a computer and is configured to process signals of the image captured by the camera 38 and to control the stage driver 32, the mounting head driver 35, the heaters 31a, 33a, the UV light lamp 36, and the vacuum pumps 41, 42.

Note that the optical waveguide sheet 17 is an example of a first component, the lens sheet 15 is an example of a second component, and the UV light lamp 36 is an example of a light source.

Figure 6A:
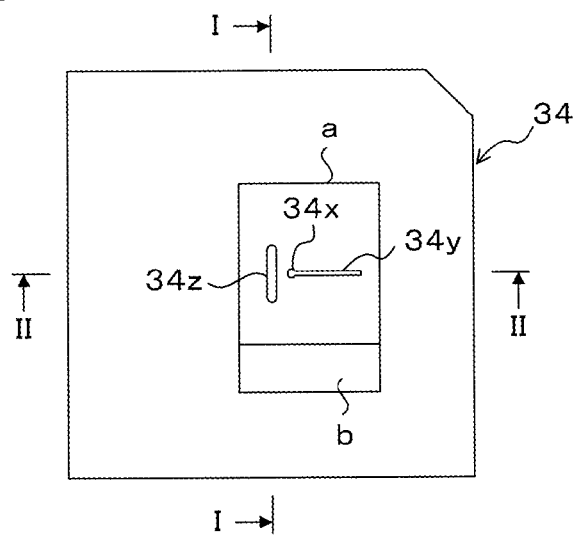
FIG. 6A is a bottom view of the component holder.
Figure 6B:
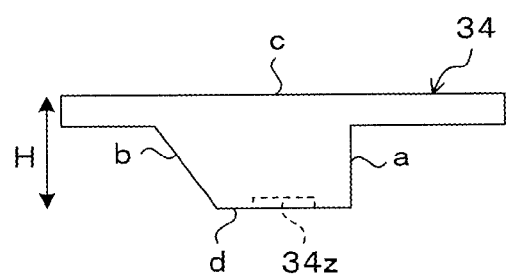
FIG. 6B is a cross-sectional view taken along the I-I line in FIG. 6A.
Figure 6C:
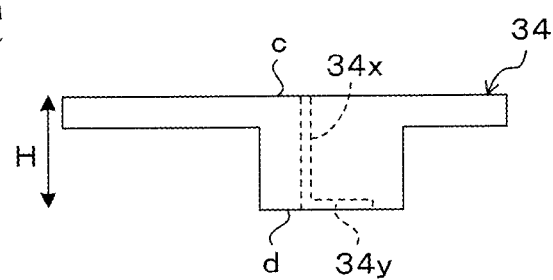
FIG. 6C is a cross-sectional view taken along the II-II line in FIG. 6A.

FIG. 6A is a bottom view of the component holder 34. FIG. 6B is a cross-sectional view taken along the I-I line in FIG. 6A. FIG. 6C is a cross-sectional view taken along the line II-II line in FIG. 6A.

As described above, the component holder 34 is formed of the transparent material such as glass or acryl resin. As illustrated in FIGS. 6A to 6C, the component holder 34 has an incident surface a on which the light emitted from the light guide 37 is made incident, and a first reflection surface b which is a surface opposite to the incident surface a and reflects the incident light from the incident surface a in an upward oblique direction.

Furthermore, the upper surface of the component holder 34 functions as a second reflection surface c which downwardly reflects the light reflected by the first reflection surface b. The bottom surface of the component holder 34 functions as an exit surface d from which the light reflected by the second reflection surface c exits. A reflection film is provided to the surfaces of the component holder 34, other than the incident surface a and the exit surface d. In the present embodiment, an Au vapor deposition film is used as the reflection film.

Note that in FIGS. 6A and 6B, reference signs 34x, 34y are a hole and a recessed portion which communicate with the vacuum pump 42, and reference sign 34z is a concave portion corresponding to a convex portion (lens) of the lens sheet 15.

Hereinafter, referring to FIG. 5, description is provided for a method of bonding the lens sheet 15 and the optical waveguide sheet 17 together by the bonding apparatus according to the present embodiment.

Here, the heaters 31a, 33a are turned on in advance and the upper surface of the stage 31 and the bottom surface of the component holder 34 are heated to a temperature of 140° C. or below. In addition, a UV light curing adhesive is applied onto the optical waveguide sheet 17 in advance. In place of a liquid adhesive, a film adhesive may be used.

First, the optical waveguide sheet 17 is placed on the stage 31 and the vacuum pump 41 is operated to fix the optical waveguide sheet 17 on the stage 31. Also, the vacuum pump 42 is operated to suction the lens sheet 15 to the underside of the component holder 34.

Next, the controller 40 controls the camera 38, so that the camera 38 is placed under the component holder 34 and captures images of the lens sheet 15 and the optical waveguide sheet 17. After that, the controller 40 controls the stage driver 32 based on the images captured by the camera 38 and thereby moves the stage 31 to align the lens sheet 15 and the optical waveguide sheet 17 with each other. After the alignment of the lens sheet 15 and the optical waveguide sheet 17 is finished, the controller 40 retracts the camera 38 aside.

Figure 7:
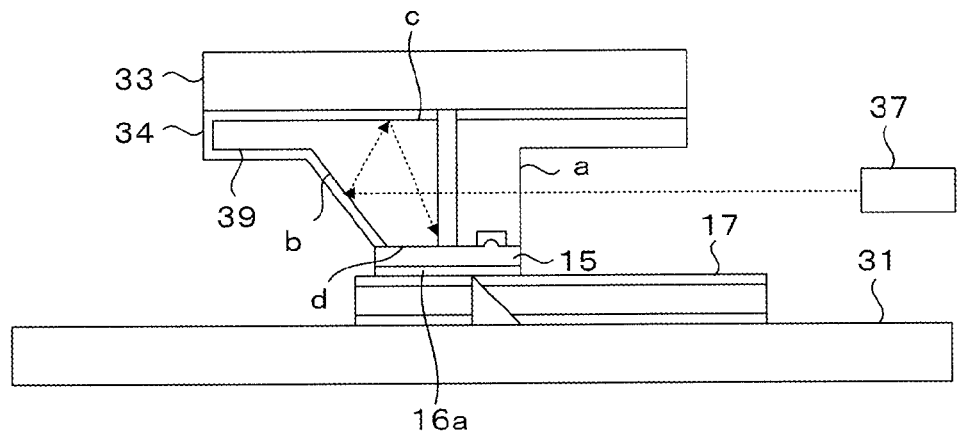
FIG. 7 is a cross-sectional view illustrating a state where an adhesive wets and spreads between the lens sheet and the optical waveguide sheet.

After that, the controller 40 controls the mounting head driver 35, and thereby lowers the mounting head 33 to place the lens sheet 15 on the optical waveguide sheet 17. When the lens sheet 15 comes closer to the optical waveguide sheet 17 to a certain extent, the adhesive wets and spreads between the lens sheet 15 and the optical waveguide sheet 17, so that the adhesive is applied to the entire underside of the lens sheet 15. FIG. 7 is a cross-sectional view illustrating this state. In FIG. 7, reference sign 16a is the UV light curing adhesive and reference sign 39 is the reflection film (Au film) provided on the first reflection surface b and the second reflection surface c.

Next, the controller 40 lights up the UV light lamp 36. Thus, UV light is emitted from the tip end of the light guide 37.

As indicated by arrows in FIG. 7, the UV light emitted from the tip end of the light guide 37 enters the component holder 34 from the incident surface a, is reflected by the first reflection surface b and the second reflection surface c in this order, and then exits from the exit surface d to irradiate the adhesive 16a under the component holder 34. By the irradiation with the UV light, the adhesive 16a is cured in about 10 seconds or less.

When the adhesive 16a is cured by the irradiation with the UV light, the controller 40 stops the vacuum pumps 41, 42. Also, the controller 40 lifts up the mounting head 33. In this manner, the bonding of the lens sheet 15 and the optical waveguide sheet 17 is completed.

In the present embodiment, the incident light from the incident surface a is reflected by the first and second reflection surfaces b, c and then exits from the exit surface d. Accordingly, an optical path from the incident surface a to the exit surface d is long. For this reason, the light sufficiently diverges while traveling from the incident surface a to the exit surface d, so that the adhesive 16a under the component holder 34 is evenly irradiated with the UV light having sufficient intensity. Thus, the lens sheet 15 and the optical waveguide sheet 17 may be bonded to each other in a short period of time.

In the present embodiment, the UV light is reflected by the first reflection surface b and the second reflection surface c, so that the length H (see, FIG. 6B and FIG. 6C) of the component holder 34 may be shortened. This also produces advantages in that the heat generated by the heater 33a may be effectively transferred to the adhesive 16a, and mounting accuracy is enhanced by preventing the component holder 34 from warping.

Note that, although the present embodiment describes the case where the UV light and the heat are used together to cure the UV light curing adhesive, the heaters 31a, 33a may be omitted if the UV light curing adhesive is cured by the UV light.

In addition, in the case of using a visible light curing adhesive, a lamp to generate visible light may be used in place of the UV light lamp 36.

Hereinafter, the description is given of results from research on optimal ranges of an angle of the first reflection surface b and a divergence angle of the UV light emitted from the light guide 37.

Figure 8:
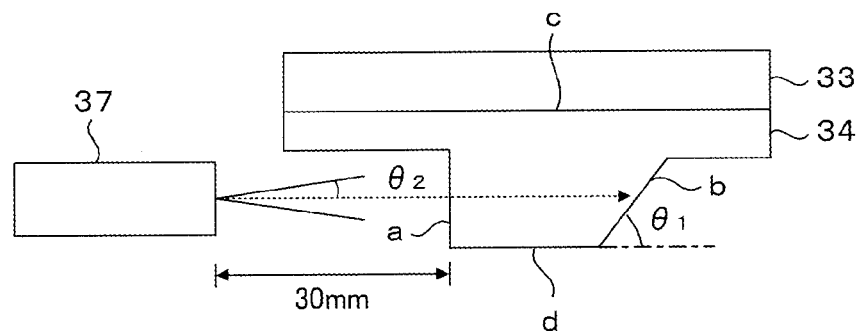
FIG. 8 is a schematic diagram presenting an angle $\theta_1$ of a first reflection surface and a divergence angle $\theta_2$ of light emitted from a light guide in calculation of a UV arrival rate through simulation.

Firstly, using the component holder 34 illustrated in FIG. 8, calculation of a UV arrival rate in the exit surface d is performed through simulation with an angle $\theta_1$ of the first reflection surface b changed. The results are presented in FIGS. 9A and 9B.

Figure 10A:
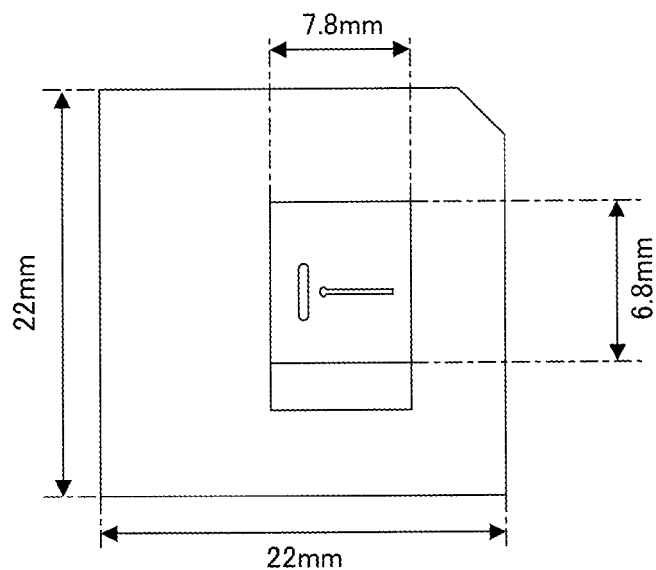
FIGS. 10A and 10B are diagrams presenting the dimensions of components of the component holder in the calculation through simulation.
Figure 10B:
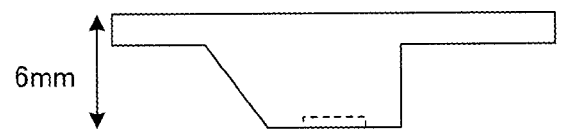

Note that the dimensions of portions of the component holder 34 are presented in FIGS. 10A and 10B. The divergence angle $\theta_2$ of the light emitted from the light guide 37 is set to 10° and the distance from the light guide 37 to the incident surface a of the component holder 34 is set to 30 mm. A material of the component holder 34 is glass (BK7) and the UV reflection rates in the first reflection surface b and the second reflection surface c are set to 90%. Furthermore, a UV arrival rate T is calculated by the equation of T=B÷A where A is an intensity of the UV light emitted from the light guide 37 and B is an intensity of the UV light in the exit surface d.

Figures 9A, 9B:
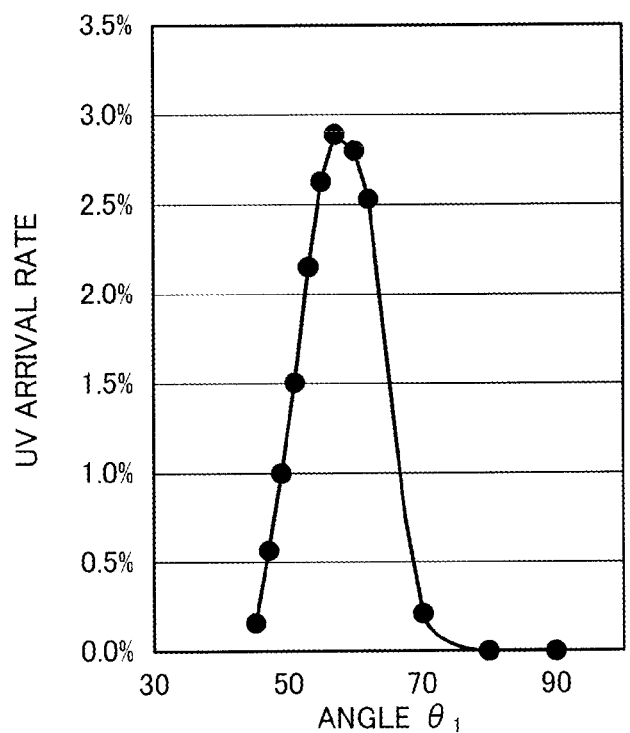
FIG. 9A is a table and FIG. 9B is a graph presenting results from the calculation of the UV arrival rate at the exit surface through simulation where the angle $\theta_1$ of the first reflection surface of the component holder is changed.

As be seen from FIGS. 9A and 9B, when the angle of the first reflection surface b is between 55° to 62°, inclusive, the UV arrival rate T is 2.5% or more. Accordingly, it is found that the optimum range of the angle $\theta_1$ of the first reflection surface b is 55° to 62°.

Next, the UV arrival rate and the in-plane distribution in the exit surface d are calculated through simulation where the angle $\theta_1$ of the first reflection surface b is set to 57° and the divergence angle $\theta_2$ of the UV light emitted from the light guide 37 is changed. The results are presented in FIGS. 11A and 11B.

Note that the in-plane distribution is expressed by a ratio (an area ratio) of an area of the exit surface d having an output of 0.003 W/mm$^2$ or more to the total area of the exit surface d.

In addition, the UV arrival rate T is calculated by the equation of T=BA as described above, but the UV arrival rates in FIGS. 11A and 11B are different from the UV arrival rates in FIGS. 9A and 9B because measurement conditions in the case of optimizing $\theta_2$ are different from measurement conditions in the case of optimizing $\theta_1$.

Figures 11A, 11B:
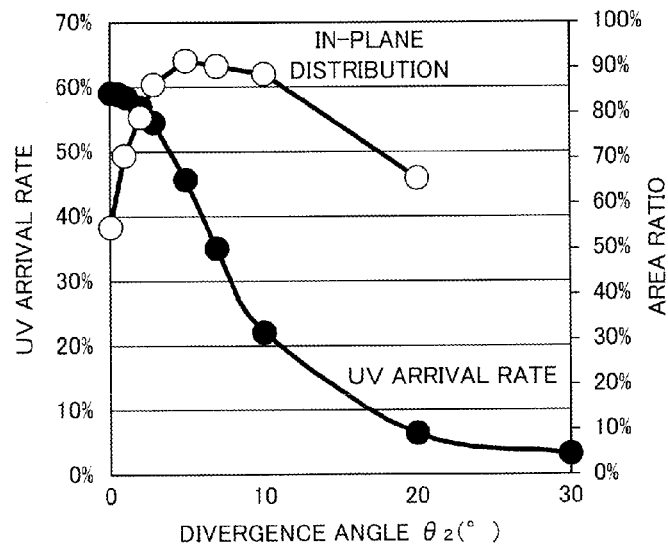
FIG. 11A is a table and FIG. 11B is a graph presenting results from the calculation of a UV arrival rate and an in-plane distribution at the exit surface through simulation where the divergence angle $\theta_2$ of the light emitted from the light guide is changed.

As be seen from FIGS. 11A and 11B, when the divergence angle $\theta_2$ of the UV light emitted from the light guide 37 is between 3° to 10°, inclusive, the area ratio is 85% or higher. Accordingly, it is found that the optimum range of the divergence angle $\theta_2$ of the UV light emitted from the light guide 37 is 3° to 10°.

Modified Example

Figure 12A:
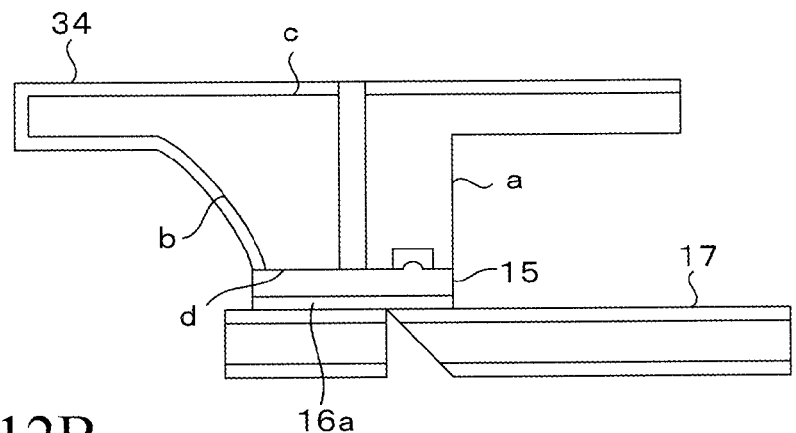
FIGS. 12A to 12C are diagrams illustrating a modified example of the first embodiment.
Figure 12B:
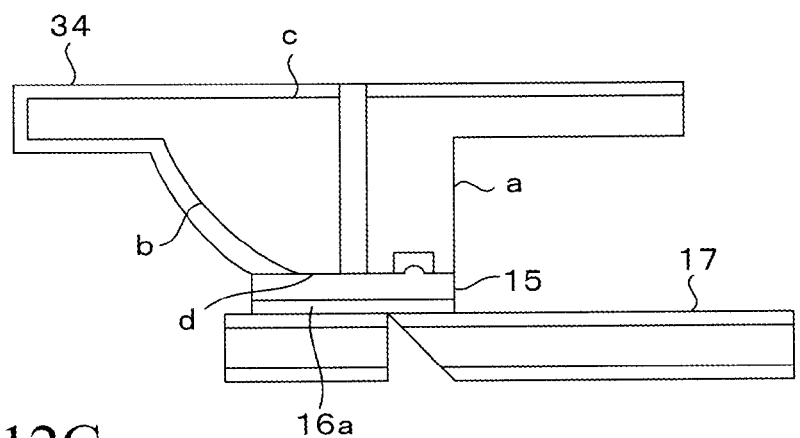
Figure 12C:
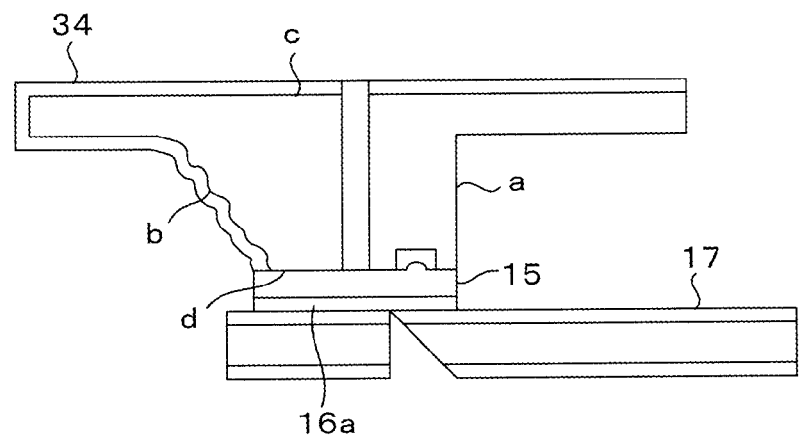

In the above-described embodiment, the first reflection surface b is a flat surface. However, the first reflection surface b may be a convex surface as in FIG. 12A or, a concave surface as in FIG. 12B. Instead, the first reflection surface b may be a textured surface having many fine asperities as in FIG. 12C.

Second Embodiment

Figure 13A:
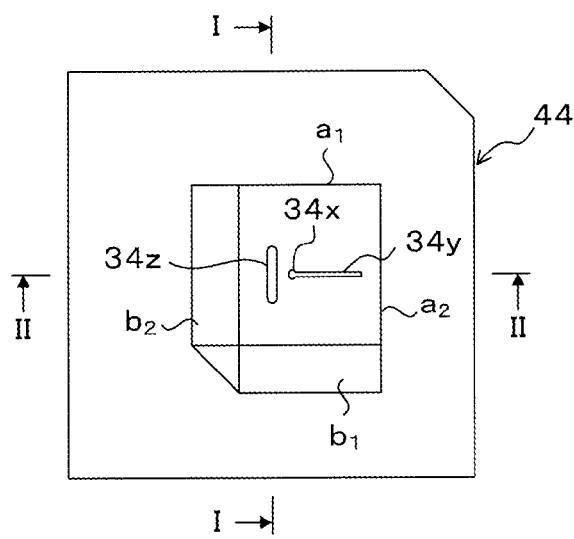
FIG. 13A is a bottom view of a component holder of a bonding apparatus according to a second embodiment.
Figure 13B:
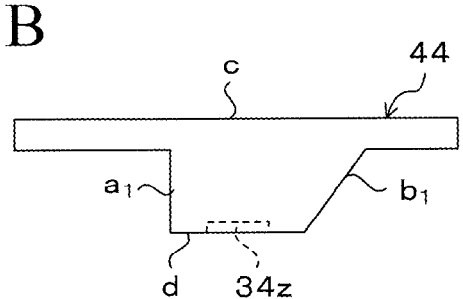
FIG. 13B is a cross-sectional view taken along the I-I line in FIG. 13A.
Figure 13C:
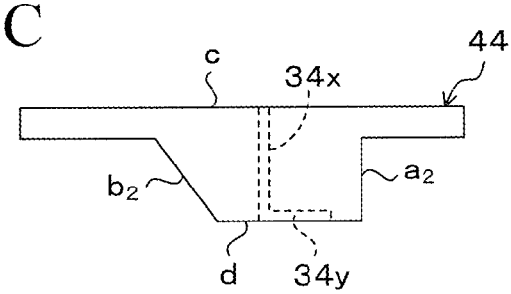
FIG. 13C is a cross-sectional view taken along the II-II line in FIG. 13A.

FIG. 13A is a bottom view of a component holder 44 of a bonding apparatus according to a second embodiment. FIG. 13B is a cross-sectional view taken along the I-I line in FIG. 13A. FIG. 13C is a cross-sectional view taken along the line II-II in FIG. 13A.

Note that the present embodiment is different from the first embodiment in that the shape of a component holder is different, and the configuration other than the shape is same as that of the first embodiment. Hence, the duplicated description is omitted herein.

As illustrated in FIGS. 13A to 13C, a component holder 44 of the bonding apparatus according to the present embodiment use two adjacent side surfaces as incident surfaces a1, a2 of UV light. A tip end of a light guide is arranged near each of the incident surfaces a1, a2. The surfaces opposite to the incident surfaces a1, a2 respectively function as first reflection surfaces b1, b2. Light reflected by the first reflection surfaces b1, b2 is reflected by a second reflection surface c (the upper surface of the component holder 44), and then exits from the exit surface d.

The component holder 34 of the first embodiment (see FIG. 7) has one optical path. In this case, if the hole 34x provided in the component holder 34 blocks light, the in-plane distribution in the exit surface d may be deteriorated.

In the present embodiment, however, the UV light enters the component holder 44 from the two adjacent side surfaces (the incident surfaces a1, a2), so that the UV light arrives at the exit surface d through the two different optical paths. This prevents the in-plane distribution in the exit surface d from being deteriorated.

Note that the first and second embodiments are both described for the case of bonding the lens sheet 15 and the optical waveguide sheet 17 together. However, the bonding apparatus disclosed herein is not only applicable to bonding the lens sheet and the optical waveguide sheet together, but also applicable to bonding various components together.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A bonding apparatus, comprising:
a light source;
a stage on which a first component is to be mounted;
a component holder formed of a light transparent material and configured to hold a second component;
a controller; and
a driver configured to be controlled by the controller to change a distance between the first component mounted on the stage and the second component held by the component holder, wherein
the component holder includes an incident surface on which light outputted from the light source is made incident, a first reflection surface which is a surface opposite to the incident surface and reflects the incident light from the incident surface, a second reflection surface which reflects the light reflected by the first reflection surface, and an exit surface from which the light reflected by the second reflection surface exits, and
the first component and the second component are bonded together with a photo-curing adhesive in a state where the component holder holds the second component on a side of the exit surface.

2. The bonding apparatus according to claim 1, wherein a heater is provided in at least one of the stage and the component holder.

3. The bonding apparatus according to claim 1, wherein the first reflection surface is a convex or concave surface.

4. The bonding apparatus according to claim 1, wherein the first reflection surface is a textured surface.

5. The bonding apparatus according to claim 1, wherein the component holder has two incident surfaces and two first reflection surfaces.

6. The bonding apparatus according to claim 1, wherein the first reflection surface is tilted at 55° to 65° with respect to an optical axis of the incident light from the incident surface.

7. The bonding apparatus according to claim 1, further comprising a light guide configured to guide the light generated by the light source to the incident surface, wherein
a divergence angle of the light emitted from the light guide is 3° to 10°.

8. A method of bonding a first component and a second component together with a photo-curing adhesive, the method comprising:
holding the second component on a side of an exit surface of a component holder formed of a transparent material and including an incident surface on which light outputted from a light source is made incident, a first reflection surface which is a surface opposite to the incident surface and reflects the incident light from the incident surface, a second reflection surface which reflects the light reflected by the first reflection surface, and the exit surface from which the light reflected by the second reflection surface exits;

aligning the first component and the second component with the photo-curing adhesive applied therebetween; and curing the photo-curing adhesive by making light incident into enter the component holder from the incident surface.

9. The method of bonding according to the claim 8, wherein, in the curing the photo-curing adhesive, heat is transferred to the photo-curing adhesive through the component holder.

* * * * *